(12) United States Patent
Gillies et al.

(10) Patent No.: US 6,669,787 B2
(45) Date of Patent: Dec. 30, 2003

(54) METHOD OF MANUFACTURING A SPIN VALVE STRUCTURE

(75) Inventors: Murray Fulton Gillies, Eindhoven (NL); Antonius Emilius Theodorus Kuiper, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 257 days.

(21) Appl. No.: 09/878,980

(22) Filed: Jun. 12, 2001

(65) Prior Publication Data

US 2002/0034661 A1 Mar. 21, 2002

(30) Foreign Application Priority Data

Sep. 18, 2000 (EP) .............................. 00203234

(51) Int. Cl.[7] .................................. C23C 8/80
(52) U.S. Cl. ................. 148/277; 148/240; 148/276; 148/284; 148/DIG. 118; 360/324.1
(58) Field of Search ................. 148/240, 275, 148/276, 277, 284, DIG. 118; 360/324, 324.1, 324.2

(56) References Cited

U.S. PATENT DOCUMENTS 5,986,858 A  * 11/1999 Sato et al. ............... 360/324.2

OTHER PUBLICATIONS

Gillies et al., "Effect of thin oxide layers incorporated in spin valve structures," Journal of Applied Physics, vol. 89, No. 11, Jun. 1, 2001, pp. 6922–6924, American Institue of Physics, p. 6923, col. 2, paragraph 3, p. 6924, col. 1, paragraph 1.
Y. Kamiguchi et al., "Co Fe Specular Spin Valves with Nano Oxiide Layer", C–7803–5555–5/99; IEEE, p. DB–01, 1999 (no month data).
Y. Shimizu et al., "Enhancement of GMR properties of Bottom Type Spin Valve Films with Ultra–Thin Free Layer Covered with Specular Oxide Capping Layer", 0–7803–5943–7 4/00; IEEE, p. FA–07, 2000 (no month data).
> Sato et al., "Effects of Interface Oxidation in Ferromagnetic Tunnel Junctions", IEEE Transactions on Magnetics, vol. 35, No. 5, Sep. 1999, pp. 2946–2948.

* cited by examiner

Primary Examiner—Andrew L. Oltmans
(74) Attorney, Agent, or Firm—Michael E. Belk

(57) ABSTRACT

The invention relates to a method of manufacturing a spin valve structure (1) of the GMR-type. Such a structure includes a stack of a magnetic layer (11a 11b), a nonmagnetic layer (15) and a sense layer (17) of a ferromagnetic material. In order to obtain a spin valve structure having a very good GMR effect the method comprises the following specific steps: oxidation of the ferromagnetic material of the sense layer; deposition of aluminium on the oxidized ferromagnetic material; oxidation of the deposited aluminium using oxygen from the oxidized ferromagnetic material.

8 Claims, 3 Drawing Sheets

METHOD OF MANUFACTURING A SPIN VALVE STRUCTURE

Figure 1:
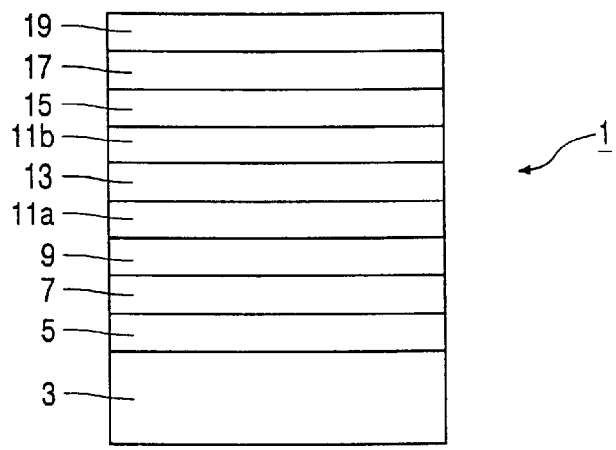

The invention relates to a method of manufacturing a spin valve structure of the giant magnetoresistive GMR) type, which structure includes a stack of a magnetic layer, a non-magnetic layer and a sense layer of a ferro magnetic material.

A spin valve structure is a magnetic multilayer structure which has a magnetoresistance effect. This implies that the resistance of such a structure changes under the influence of an external magnetic field. In the case of spin valve structures the magnetoresistance effect is mostly referred to as the giant magnetoresistance (GMR) effect. Many of the present magnetic disk devices use spin valve structures as sensing elements. These structures also find application in devices of other technical areas, such as in automotive sensors and in magnetic RAMs.

Only the section magnetic layer/non-magnetic layer/sense layer of a spin valve structure contributes to the GMR effect and is consequently the active area of the structure. Other areas, the non-active areas, of the spin valve structure may shunt electrical current from said active area. Some interface layers present in the structure may reduce the GMR effect by introducing non-specular reflection, i.e. the electrons are scattered, resulting in loss of their spin information.

A paper identified by C-7803-5555-5/99; IEEE, page DB-01; entitled "Co Fe specular spin valves with nano oxide layer" by Y. Kamiguchi et al, discloses a spin valve structure of the giant magnetoresistive type. The following sample is discussed in this paper: SiO structrate/Ta 5 nm/NiFe 2 nm/IrMn 7 nm/pinned layer with NOL/Cu 2 nm/CoFe 2 nm/CoFeO 4 nm/TaO 0.4 nm. In this sample the spin valve structure is a CoFe specular structure with metal antiferromagnetic materials for exchange biasing. This structure has a pinned layer containing a nano oxide layer (NOL) for enhancing specular electron scattering. The sample was deposited by magnetron sputtering.

In the spin valve structure disclosed in said IEEE paper the active area comprises the pinned layer with the NOL, the Cu layer and the CoFe layer, wherein the NOL serves to reflect electrons.

An object of the invention is to provide a method by means of which it is possible to realize a spin valve structure having an effective means for specularly reflecting electrons at the location of the sense layer.

This object is obtained by the method according to the invention as defined in claim 1, i.e. a method of manufacturing a spin valve structure of the giant magnetoresistive type, which structure includes a stack of a magnetic layer, a non-magnetic layer and a sense layer of a ferromagnetic material, which method includes a step of oxidizing the ferromagnetic material of the sense layer, followed by a step of depositing aluminium on the oxidized ferromagnetic material of the sense layer, whereafter this aluminium oxidizes to an aluminium oxide film using oxygen from the oxidized ferromagnetic material of the sense layer. In this way an Al-oxide film is formed by successively forming an auxiliary oxide film on the sense layer, forming a metallic Al-layer on this auxiliary oxide film and oxidizing the aluminium of this Al-layer by using oxygen from the auxiliary oxide film. Generally, the said layers are thin-film layers. Each layer may be a single layer or may have a multilayer structure. The magnetic layer can have a magnetization fixed or pinned by various means, known per se. A suitable material for forming the magnetic layer is e.g. an alloy of CoFe. The non-magnetic layer may be formed of Cu. The magnetization of the sense layer is free to be affected by an applied external magnetic field. Preferably, the metal Co, an alloy of CoFe or an alloy of NiFe is chosen as the ferromagnetic material for forming the sense layer. Since aluminium is more electronegative than either Co or Fe the auxiliary oxide is reduced during oxidation of Al to metallic Co, CoFe and NiFe, respectively, and an Al-oxide is formed.

It has been proven that the aluminium oxide formed in the above way is a closed oxide and yields a sharp interface, which provides a specular reflection and thus does not perturb the electron spin mechanism of the active area of the structure, resulting in an considerably improved MR signal. An Al-oxide layer of about 2 nm appears to be an excellent protection against oxidation of the sense layer, so that ultra thin sense layers can be applied. Such sense layers are required for high density magnetic recording because of the need of high sensitivity. Measurements have shown that the coercivity of the structures obtained is relatively low, of the order of 15 Oe, and exhibits hardly any temperature dependence. The method according to the invention can utilize of thin-film technology known per se.

It is to be noted that a paper identified by O-7803-5943-7 4/00; IEEE, page FA-07; entitled "Enhancement of GMR properties of bottom type spin valve films with ultra-thin free layer covered with specular oxide capping layer" by Y. Shimizu et al, discloses a CoFeB free layer covered with an Al-oxide capping layer formed by pure Ar gas sputtering of an $Al_2O_3$ target. The method known from this paper is entirely different from the method described in the present patent document, because no auxiliary oxide is formed as oxygen source for forming the Al-oxide. Since oxidation from an auxiliary oxide is absent in the device resulting from the known method and interface mixing is likely to occur, the effects obtained by the method according to the invention are not obtained by this known method.

It is further to be noted that a paper identified by IEEE Transactions on Magnetics, vol. 35, no. 5, September 1999, pages 2946–2948; entitled "Effects of interface oxidation in ferromagnetic tunnel junctions" by Masashige Sato et al, discloses tunnel junctions with oxidized Al barriers. In a sample disclosed, a surface of a bottom Co layer of a tunnel junction magnetoresitive (TMR) device was exposed to air, prior to the depositing af Al, whereafter the Al layer formed was oxidized in rf oxygen plasma. In said paper it is assumed that the oxidized Co surface acts as a diffusion-prevention layer and the unoxidized Al layer will be oxidized with the oxygen atoms from the oxidized Al and the oxidized Co by annealing. All the knowledge as to the method, device and effects disclosed is the last-mentioned paper is restricted to TMR structures; no information relating to GMR structures is derivable from this paper.

The invention further relates to a spin valve structure obtained by the method according to an invention. Thus, the spin valve structure according to the invention has interface oxidation at the location of the sense layer. In general, the structure may be provided with a pinned layer with NOL as disclosed in the first-mentioned IEEE paper.

The invention further relates to a read head, a field sensor and a magnetic memory, respectively, each provided with a spin valve structure of the giant-magnetoresistive type obtained by or obtainable by the method according to the invention.

The invention further relates to an apparatus for reading information from a magnetic storage medium, the apparatus including the read head according to the invention.

The invention further relates to an electronic circuit including a magnetic memory according to the invention.

With reference to the claims, it is to be noted that various characteristic features defined in the set of claims may occur in combination.

The above-mentioned and other aspects of the invention are apparent from and will be elucidated, by way of non-limitative example, with reference to the embodiments described hereinafter.

Figure 2:
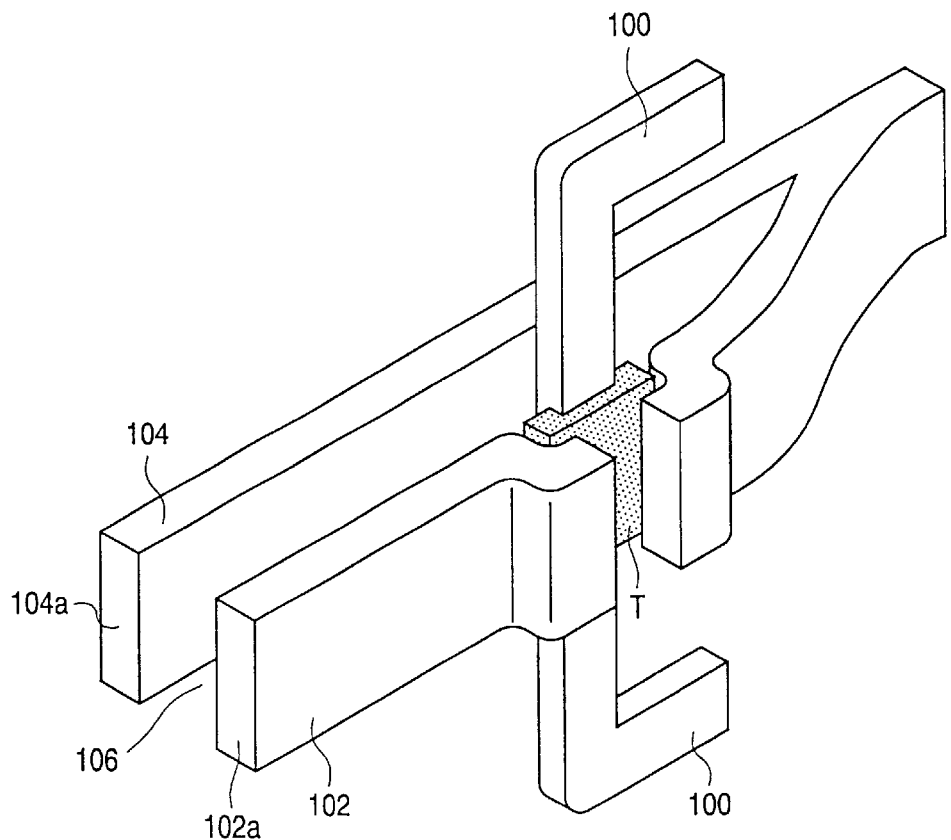
Figure 3:
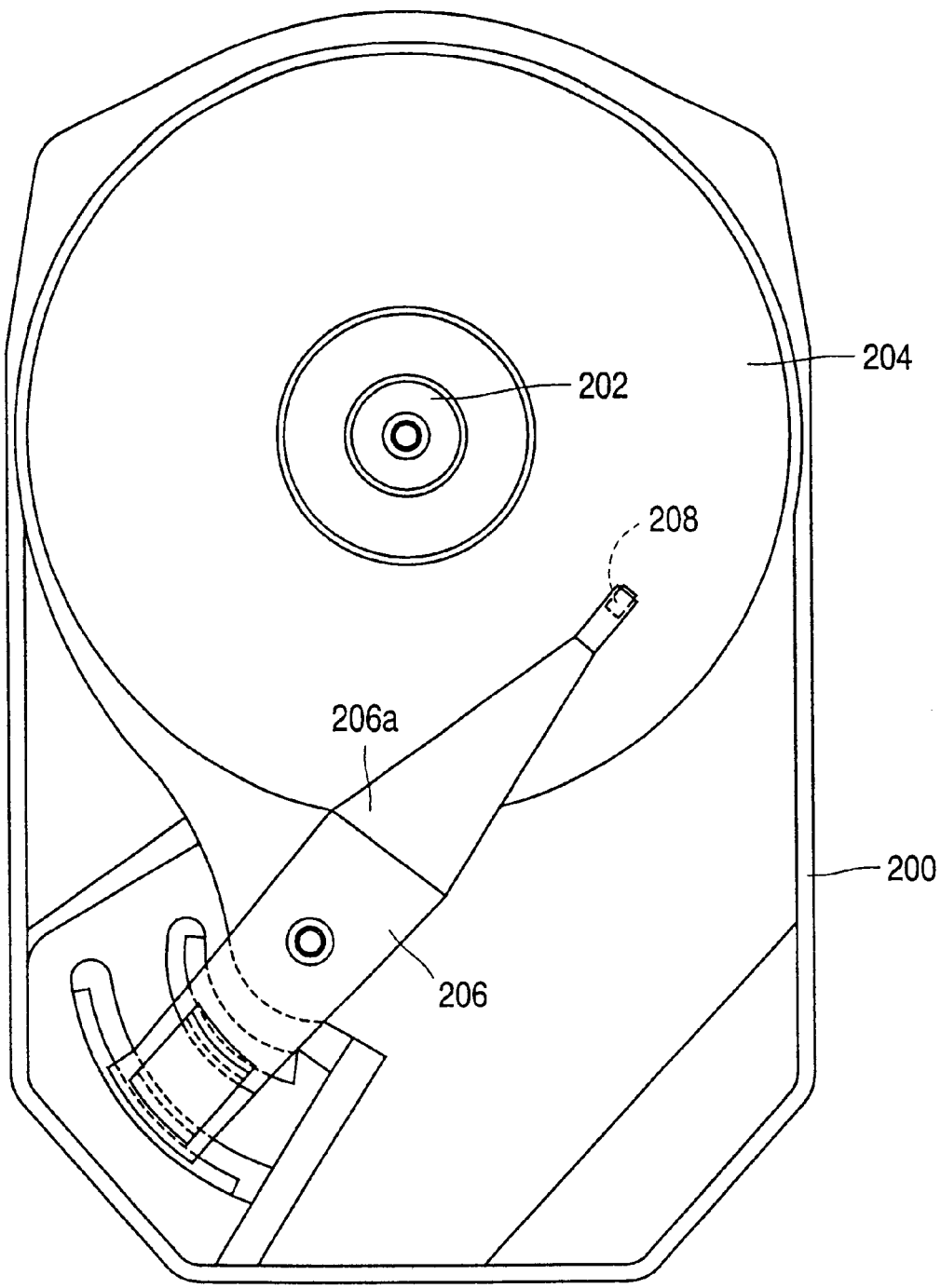
Figure 4:
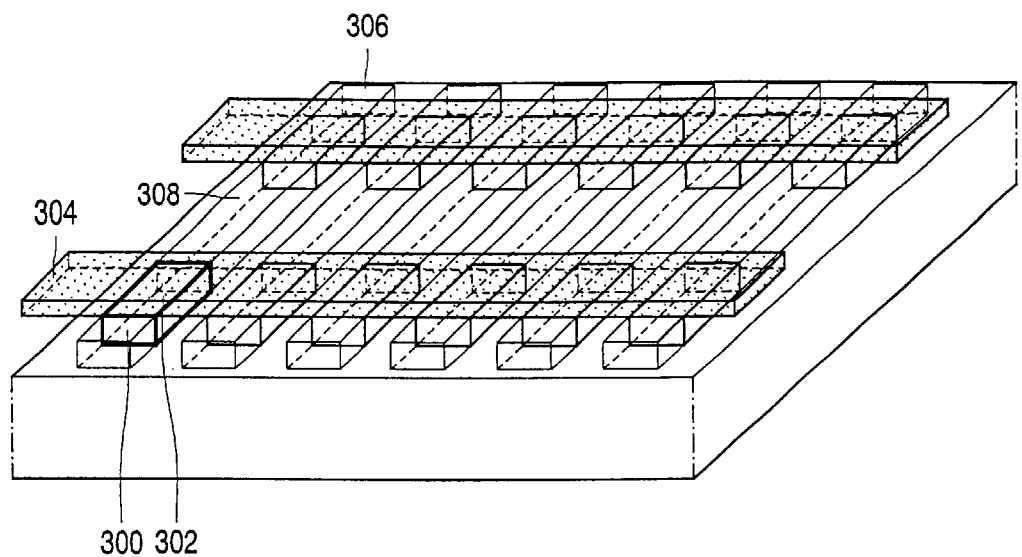
Figure 5:
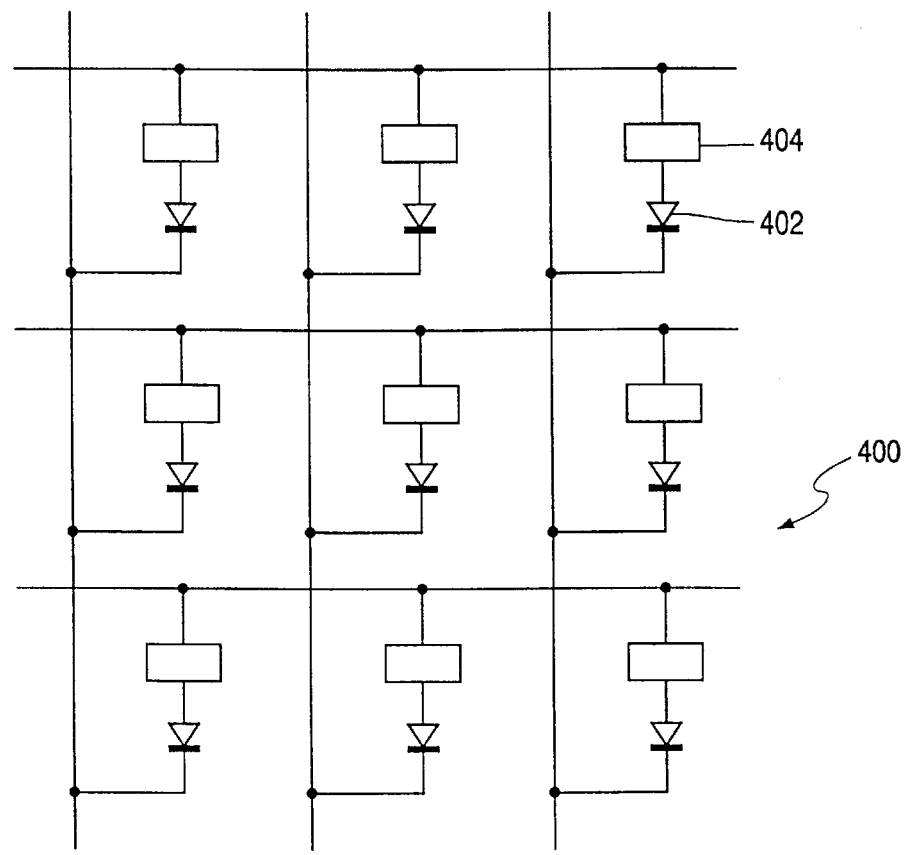

In the drawings:

FIG. 1 is a diagrammatic cross-sectional view of an embodiment of the spin valve structure according to the invention, FIG. 2 is a diagrammatic perspective view of an embodiment of the read head according to the invention, FIG. 3 shows diagrammatically an embodiment of the apparatus according to the invention, FIG. 4 is a diagrammatic perspective view of an embodiment of the magnetic memory according to the invention and FIG. 5 is a diagrammatic view of an embodiment of the electronic circuit according to the invention.

The spin valve structure 1 diagrammatically shown in FIG. 1 is provided with a stack of substantially parallel layers supported by a substrate 3. The substrate 3 may be comprised of a non-magnetic, non-conducting material, such as Si, and may be part of a wafer. The stack comprises a number of layers, of which two layers 5 and 7 of Ta and NiFe, respectively, serve as seed layers and give a correct crystalline texture for a layer 9 of IrMn of the stack. The layer 9 is an antiferromagnet which is a pinning layer for pinning the magnetization of a magnetic multilayer 11a and 11b of CoFe of the stack being a pinned layer of the structure. In order to confine electrons to the active layers of the structure a reflecting layer 13 of $CoFeO_x$, also referred to NOL, is present between the layers 11a and 11b. The reflecting layer 13 is formed by oxidation of CoFe. Alternatively, an alloy containing a ferromagnetic element and a more electronegative element may be used. A layer 15 of Cu of the stack serves to break the exchange coupling between the pinned layer and a sense layer 17, which is a ferromagnetic layer of CoFe in this example and is a part of the stack. Upon the sense layer 17 a special oxidic layer 19 has been formed by means of the method according to the invention. According to this method, after the sense layer 17 has been formed, a film of the ferromagnetic material of this layer is oxidized to an oxide, in this example to a CoFe oxide, whereafter Al is deposited, e.g. by means of sputtering, on the oxidized layer 17 to form an Al-film on this layer, followed by an oxidation process of the deposited Al, during which process oxygen from the oxidized layer 17 is used to form the oxidic layer 19, in this example an Al-oxide layer having a close structure and forming a sharp interface with the sense layer 17.

The spin valve structure 1 as shown in FIG. 1 and provided with the necessary connecting pads may be used as a field sensor, in particular a GMR-sensor. Sensors of such a kind are particularly suitable for automotive and industrial applications. Examples are digital position sensors and analog angle sensors.

FIG. 2 renders a part of a magnetic read head. The read head comprises a transducer T with electrical connections 100. The transducer T includes an embodiment of the spin valve structure according to the invention, e.g. the embodiment as shown in FIG. 1. The read head comprises flux guides 102, 104, which are positioned relative to the transducer T so as to form a magnetic circuit. The flux guides 102, 104 have end faces 102a, 104a forming pole faces of the head, a magnetic gap 106 being located between said faces.

If a magnetic medium, such as a magnetic tape, disc or card, moves past the faces 102a, 104a in close proximity thereto, magnetically-stored information on that medium will generate a varying magnetic flux in the above-mentioned magnetic circuit, which flux is also fed through the transducer T. The transducer T converts the varying magnetic flux into electrical resistance variations, which can be measured by a suitable measuring instrument connected to the electrical connections 100. Such a magnetic head may also include an induction coil, which can be employed in the recording of magnetic information on a magnetic medium.

An embodiment of the apparatus according to the invention is shown in FIG. 3. This apparatus includes a frame 200 and a spindle 202 rotatably mounted in the frame 200 for carrying a disc-like information carrier 204, such as a hard disc or a magneto-optical disc. The information carrier 204 may be an integrated carrier or a removable carrier. The apparatus further includes a swing-arm 206 carrying via a flexure 206a an embodiment of the read head according to the invention, here indicated by the numeral 208. Drives are provided for driving the spindle 202 and the arm 206. In an operational state the head 208 scans the rotating information carrier 204, the head being disposed opposite to the information carrier 204 and moving substantially radially with respect to the carrier 204. The apparatus shown may be part of a data storage system, an audio system or a video system. The apparatus according to the invention may also be an apparatus for reading information from a tape or a card.

An embodiment of the magnetic memory according to the invention is disclosed in FIG. 4. This memory includes memory elements 302, word-lines 304 and bit-lines 306 to select a specific memory element. Each memory element 302 includes an embodiment of the spin valve structure according to the invention, here indicated by the numeral 300. The memory elements 302 in a bit line 206 may be separated from each other by a non-magnetic metal 308 with low resistivity, e.g. Cu.

Although the invention has been shown and described with reference to preferred embodiments, it will be understood by those skilled in the art that various changes or modifications in form, detail and/or material may be made without departing from the scope and the spirit of the invention as disclosed in this document. Particularly, ferromagnetic materials other than mentioned may be suitable for the sense layer. Moreover, there may be a diversity of applications of spin valve structures obtained by the method according to the invention, which method may include thin-film techniques known per se.

What is claimed is:

1. A method of manufacturing a spin valve structure of the giant magnetoresistive type, which structure includes a stack formed upon a nonmagnetic substrate such that a first edge of the stack is near the substrate and a second edge of the stack is away from the substrate wherein the second edge of the stack is formed of a magnetic layer, a nonmagnetic layer and a sense layer of a ferromagnetic material such that the sense layer is nearest the second edge, which method includes oxidizing the ferromagnetic material of the sense layer, followed by depositing aluminum on the oxidized ferromagnetic material of the sense layer, whereafter this aluminum oxidizes to an aluminum oxide film using oxygen from the oxidized ferromagnetic material of the sense layer.

2. A method according to claim 1, wherein the metal Co, an alloy of CoFe or an alloy of NiFe is chosen as the ferromagnetic material for forming the sense layer.

3. A spin valve structure of the giant-magnetoresistive type obtained by the method according to claim 1.

4. A read head provided with a spin valve structure obtained by the method according to claim 1.

5. A field sensor provided with a spin valve structure obtained by the method according to claim 1.

6. A magnetic memory provided with a spin valve structure obtained by the method according to claim 1.

7. An apparatus for reading information from a magnetic storage medium, which apparatus includes the read head according to claim 4.

8. An electronic circuit including the magnetic memory according to claim 6.

* * * * *